(12) United States Patent
Zhang et al.

(10) Patent No.: US 11,133,700 B2
(45) Date of Patent: Sep. 28, 2021

(54) POWER SUPPLY DEVICE AND CHARGING CONTROL METHOD

(71) Applicant: GUANGDONG OPPO MOBILE TELECOMMUNICATIONS CORP., LTD., Guangdong (CN)

(72) Inventors: Jialiang Zhang, Guangdong (CN); Chen Tian, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 434 days.

(21) Appl. No.: 16/273,526

(22) Filed: Feb. 12, 2019

(65) Prior Publication Data

US 2019/0190305 A1    Jun. 20, 2019

Related U.S. Application Data

(63) Continuation of application No. PCT/CN2017/081849, filed on Apr. 25, 2017.

(51) Int. Cl.
   *H02J 7/00* (2006.01)
   *H02J 7/14* (2006.01)
   (Continued)

(52) U.S. Cl.
   CPC ........ *H02J 7/045* (2013.01); *G01R 19/16542* (2013.01); *G05F 1/462* (2013.01);
   (Continued)

(58) Field of Classification Search
   USPC ....................................... 320/109, 134, 140
   See application file for complete search history.

(56) References Cited

U.S. PATENT DOCUMENTS

| 5,442,274 A | 8/1995 | Tamai |
| 7,426,126 B1 * | 9/2008 | Lai .................. H02J 7/022 363/146 |

(Continued)

FOREIGN PATENT DOCUMENTS

| CN | 1767312 | 5/2006 |
| CN | 101431250 | 5/2009 |

(Continued)

OTHER PUBLICATIONS

JPO, Office Action for JP Application No. 2019-534845, dated Jun. 16, 2020.

(Continued)

*Primary Examiner* — Alexis B Pacheco
(74) *Attorney, Agent, or Firm* — Hodgson Russ LLP

(57) ABSTRACT

The present disclosure provides a power supply device and a charging control method. The power supply device includes a primary conversion circuit, a secondary conversion circuit, a transformer, a feedback control circuit, and a power adjustment circuit. An input end of the feedback control circuit is coupled to both ends of an inductance element in the secondary conversion circuit. The feedback control circuit is configured to sample an output current of the power supply device based on the impedance of the inductance element to obtain a current sampling value, and to generate a feedback signal according to the current sampling value. The power adjustment circuit is coupled to an output end of the feedback control circuit, and is configured to adjust a power coupled from the primary conversion circuit to the secondary conversion circuit via the transformer according to the feedback signal.

20 Claims, 5 Drawing Sheets

(51) Int. Cl.
*H02J 7/04* (2006.01)
*H02J 7/02* (2016.01)
*H02M 3/335* (2006.01)
*G01R 19/165* (2006.01)
*G05F 1/46* (2006.01)
*H02M 3/28* (2006.01)
*H02M 1/00* (2006.01)

(52) U.S. Cl.
CPC ............... *H02J 7/00* (2013.01); *H02J 7/022* (2013.01); *H02M 3/28* (2013.01); *H02M 3/33523* (2013.01); *H02M 1/0009* (2021.05)

(56) References Cited

U.S. PATENT DOCUMENTS

| | | | |
|---|---|---|---|
| 10,910,861 B2* | 2/2021 | Tian | H02J 7/00714 |
| 2005/0017706 A1 | 1/2005 | Balakrishnan et al. | |
| 2008/0211312 A1* | 9/2008 | Zhou | H02M 3/33507 307/75 |
| 2009/0267582 A1 | 10/2009 | Prodic et al. | |
| 2011/0074384 A1* | 3/2011 | Labib | G01R 19/0092 324/76.11 |
| 2012/0153917 A1* | 6/2012 | Adell | H02M 3/1588 323/283 |
| 2015/0221204 A1 | 8/2015 | Barrena et al. | |
| 2015/0280590 A1* | 10/2015 | Maede | H02M 3/33515 363/21.06 |
| 2016/0233713 A1 | 8/2016 | Cheng | |
| 2017/0085184 A1* | 3/2017 | Lai | H02M 3/33507 |
| 2017/0102751 A1* | 4/2017 | Zeng | H02J 7/342 |
| 2017/0155335 A1 | 6/2017 | Chang et al. | |

FOREIGN PATENT DOCUMENTS

| | | |
|---|---|---|
| CN | 101860236 | 10/2010 |
| CN | 103329416 | 9/2013 |
| CN | 104467406 | 3/2015 |
| CN | 105430812 | 3/2016 |
| CN | 105634073 | 6/2016 |
| CN | 106026327 | 10/2016 |
| CN | 106253422 | 12/2016 |
| DE | 2558805 | 7/1977 |
| GB | 190712495 | 6/1908 |
| JP | 06105545 | 4/1994 |
| JP | H10285819 | 10/1998 |
| JP | H1127875 | 1/1999 |
| JP | 2005057871 | 3/2005 |
| JP | 2009112134 | 5/2009 |
| JP | 2012182954 | 9/2012 |
| JP | 2013187938 | 9/2013 |
| WO | 2017099594 | 6/2017 |
| WO | 2017133388 | 8/2017 |

OTHER PUBLICATIONS

SIPO, First Office Action for CN Application No. 201780061417.0, dated Jun. 2, 2020.
EPO, Office Action for EP Application No. 17907363.0, dated May 12, 2020.
IPO, Office Action for IN Application No. 201917014317, dated Mar. 3, 2020.
Zhang et al., "Modeling and Analysis of an Off-line Battery Charger for Single Cell Lithium Batteries," IEEE Applied Power Electronics Conference and Exposition, Feb. 2004, vol. 3, pp. 1796-1802.
EPO, Office Action for EP Application No. 17907363.0, dated Jun. 27, 2019.
EPO, Communication for EP Application No. 17907363.0, dated Oct. 16, 2020.
KIPO, Office Action for KR Application No. 10-2019-7014399, dated Nov. 16, 2020.
JPO, Office Action for JP Application No. 2019-522271, dated Jun. 2, 2020.
WIPO, English Translation of the ISR and WO for PCT/CN2017/081849, dated Dec. 25, 2017.
KIPO, Office Action for KR Application No. 10-2019-7014399, dated Apr. 26, 2021.

* cited by examiner

POWER SUPPLY DEVICE AND CHARGING CONTROL METHOD

CROSS-REFERENCE TO RELATED APPLICATIONS

This application is a continuation application of International Application No. PCT/CN2017/081849, filed on Apr. 25, 2017, the entire disclosure of which is incorporated herein by reference.

TECHNICAL FIELD

The present disclosure generally relates to a charging technology field, and more particularly, to a power supply device and a charging control method.

BACKGROUND

A power supply device may realize a function of converting input alternating current (for example, mains supply) to a voltage and/or a current suitable for charging a device to be charged. There is a need to improve the power supply device.

SUMMARY

In an aspect, a power supply device is provided. The power supply device includes a primary conversion circuit, a secondary conversion circuit, and a transformer between the primary conversion circuit and the secondary conversion circuit. The primary conversion circuit is configured to perform primary rectification and/or primary filtering on input alternating current. The transformer is configured to couple an output power of the primary conversion circuit to the secondary conversion circuit. The secondary conversion circuit is configured to perform secondary rectification and secondary filtering based on a power coupled from the primary conversion circuit to the secondary conversion circuit to generate an output current of the power supply device. The secondary conversion circuit includes an inductance element for secondary filtering. The power supply device further includes: a feedback control circuit, wherein an input end of the feedback control circuit is coupled to both ends of the inductance element, and the feedback control circuit is configured to sample the output current of the power supply device based on an impedance of the inductance element to obtain a current sampling value of the output current of the power supply device, and to generate a feedback signal according to the current sampling value; and a power adjustment circuit, coupled to an output end of the feedback control circuit, and configured to adjust the power coupled from the primary conversion circuit to the secondary conversion circuit via the transformer according to the feedback signal.

In another aspect, a charging control method is provided. The charging control method includes: performing primary rectification and/or primary filtering on input alternating current by a primary conversion; performing secondary rectification and secondary filtering based on a power coupled from the primary conversion to the secondary conversion to generate an output current, wherein the secondary filtering is performed based on an inductance element; sampling the output current based on an impedance of the inductance element to obtain a current sampling value of the output current, and generating a feedback signal according to the current sampling value; and adjusting the power coupled from the primary conversion to the secondary conversion according to the feedback signal.

In yet another aspect, a charging control method of using a power supply device that performs secondary conversion based on an inductance element is provided. The method includes: operating the power supply device to perform primary conversion on input alternating current; operating the power supply device to perform secondary conversion based on a power coupled from the primary conversion to the secondary conversion to generate an output current of the power supply device; operating the power supply device to sample the output current of the power supply device based on an impedance of the inductance element to obtain a current sampling value of the output current of the power supply device, and to generate a feedback signal according to the current sampling value; and operating the power supply device to adjust the power coupled from the primary conversion to the secondary conversion according to the feedback signal.

DETAILED DESCRIPTION

A power supply device in the related art typically includes a primary conversion circuit, a secondary conversion circuit, and a transformer between the primary conversion circuit and the secondary conversion circuit. The secondary conversion circuit of the power supply device typically includes many circuit elements, for example, an element for secondary rectification, an element for secondary filtering, an element for current detection, and the like, which results in a complicated structure of the secondary conversion circuit, and a higher power loss.

Therefore, embodiments of the present disclosure provide a power supply device, which may simplify a structure of the secondary conversion circuit, and reduce a power loss of the secondary conversion circuit.

Hereinafter, embodiments of the present disclosure are described in detail with reference to FIG. 1.

Figure 1:
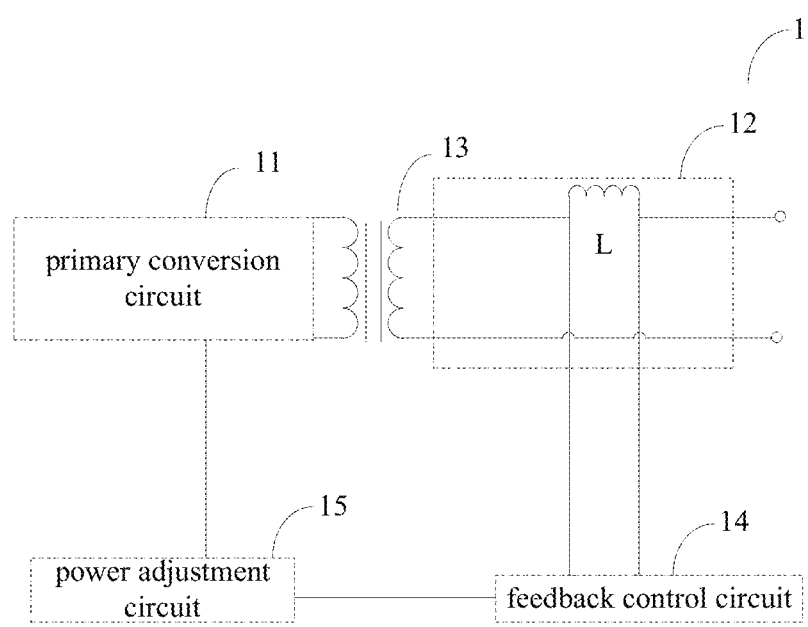
FIG. 1 is a schematic diagram of a power supply device according to an embodiment of the present disclosure.

As illustrated in FIG. 1, the power supply device 1 according to an embodiment of the present disclosure may include a primary conversion circuit 11, a secondary conversion circuit 12, and a transformer 13 between the primary conversion circuit 11 and the secondary conversion circuit 12. The primary conversion circuit 11 may be configured to perform primary rectification and/or primary filtering on input alternating current. The transformer 13 may be configured to couple an output power of the primary conversion circuit 11 to the secondary conversion circuit 12. The secondary conversion circuit 12 may be configured to perform secondary rectification and secondary filtering based on the power coupled from the primary conversion circuit 11 to the secondary conversion circuit 12, to generate an output voltage and an output current of the power supply device 1. The secondary conversion circuit 12 may include an inductance element L for the secondary filtering. The inductance element L may be referred to as, for example, a filter inductor. The inductance element L may be specifically configured to reduce a ripple wave of the output voltage and/or the output current of the power supply device 1.

Further, the power supply device 1 may further include a feedback control circuit 14 and a power adjustment circuit 15. An input end of the feedback control circuit 14 is coupled to both ends of the inductance element L. The feedback control circuit 14 is configured to sample the output current of the power supply device 1 based on an impedance of the inductance element L to obtain a current sampling value of the output current of the power supply device 1, and to generate a feedback signal according to the current sampling value. The power adjustment circuit 15 is coupled to an output end of the feedback control circuit 14, and is configured to adjust the power coupled from the primary conversion circuit 11 to the secondary conversion circuit 12 via the transformer according to the feedback signal. The feedback signal outputted from the feedback control circuit 14 may be configured to indicate whether the output current of the power supply device 1 reaches a target current (or an expected current).

The power supply device typically needs to detect a value of the output current thereof, and to adjust the output current of the power supply device according to the detecting result. In order to detect the value of the output current of the power supply device, in the related art, a current detection resistor is coupled in series on a secondary bus of the power supply device, and the output current of the power supply device is sampled based on the impedance of the current detection resistor. In contrast, the power supply device 1 according to embodiments of the present disclosure samples the output current of the power supply device 1 using the impedance of the inductance element L for secondary filtering in the secondary conversion circuit 12, saving the current detection resistor, and thus reducing the number of parts and the power loss of the secondary conversion circuit of the power supply device.

In detail, for the power supply device including both the inductance element for secondary filtering and the current detection resistor, the power loss of the power supply device performing the secondary filtering and the current detection is about a multiple of a square of the impedance of the inductance element and the impedance of the current detection resistor. In contrast, in embodiments of the present disclosure, the inductance element is not only used to perform secondary filtering, but also used to perform current detection, such that the power loss of the power supply device performing the secondary filtering and the current detection is merely a multiple of a square of the impedance of the inductance element L, which reduces the power loss of the secondary conversion circuit 12, and reduces the number of circuit elements of the secondary conversion circuit 12.

The power supply device 1 provided by the present disclosure may be any device capable of converting the alternating current to the voltage and/or current suitable for charging the device to be charged. As an example, the power supply device 1 may be an adapter.

It should be understood that, structures of respective circuit units in FIG. 1 are not specifically limited in embodiments of the present disclosure. In the following, FIG. 2 is taken as an example for detailed description.

Figure 2:
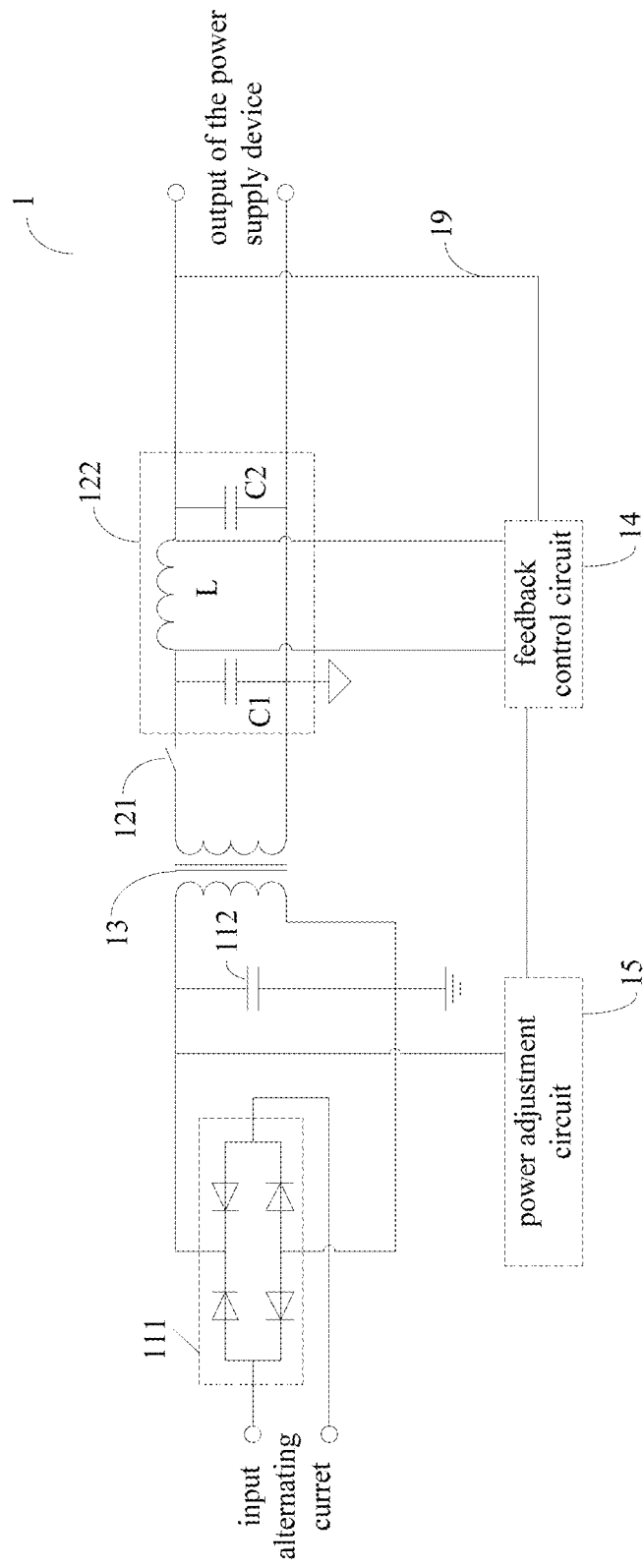
FIG. 2 is a schematic diagram illustrating a circuit of a power supply device according to an embodiment of the present disclosure.

As illustrated in FIG. 2, the primary conversion circuit may include a primary rectifier circuit 111 and a primary filtering circuit 112. The primary rectifier circuit 111 may be a full-bridge rectifier circuit consisting of four diodes (FIG. 2 is illustrated by taking a full-bridge rectifier circuit as an example), or may be a half-bridge rectifier circuit. The primary filtering circuit 112 may include one or more capacitance elements, and the capacitance element may be a liquid aluminum electrolytic capacitor.

Continue to see FIG. 2, the secondary conversion circuit 12 may include a secondary rectifier circuit 121 and a secondary filtering circuit 122. As illustrated in FIG. 2, the secondary rectifier circuit 121 may be implemented by a switch, or may be implemented by a rectifier diode. The secondary filtering circuit 122 may perform the secondary filtering based on the inductance element L in combination with other elements. As an example, as illustrated in FIG. 2, the secondary filtering circuit 122 may include the inductance element L and two circuits C1 and C2 before and after the inductance element L. The inductance element L and the two circuit C1 and C2 together form a π type loss-pass filter (or, referred to as a C-L-C type filter). As another example, the secondary filtering circuit 122 may be a LC type filter consisting of the inductance element L and one capacitance element.

The transformer 13 may be a common transformer, or may be a high frequency transformer whose working frequency is 50 KHz-2 MHz.

The feedback control circuit 14 may realize the current detection function based on the impedance of the inductance element L. For example, the feedback control circuit 14 may include a galvanometer and an operational amplifier. The galvanometer may be configured to sample the current across both ends of the inductance element L to obtain a current sampling value, and to convert the current sampling value to a corresponding voltage sampling value. The operational amplifier may be configured to compare the voltage sampling value with a reference voltage value, to generate the feedback signal. The feedback signal may be a voltage signal. A voltage value of the feedback signal being 0 may indicate that the output current of the power supply device 1 reaches an expected value, and the voltage value of the feedback signal being not 0 may indicate that the output current of the power supply device 1 does not reach the expected value. The feedback control circuit 14 may further include a control unit (for example, a MCU (microcontroller unit)). The control unit may adjust the value of the reference voltage according to actual demands.

Further, in some embodiments, the feedback control circuit 14 may further include a voltage detection circuit. The voltage detection circuit may be, for example, coupled to an output end of the secondary filtering circuit 122 via the wire 19 illustrated in FIG. 2, for detecting the output voltage of the power supply device.

The power adjustment circuit 15, for example, may include a PWM (pulse width modulation) controller and a switch unit. The switch unit may be coupled to a primary coil of the transformer. The PWM controller may adjust the power coupled from the primary conversion circuit 11 to the secondary conversion circuit 12 by adjusting a duty ratio of a control signal sent to the switch unit. Moreover, in some embodiments, the power adjustment circuit 15 may be coupled to the feedback control circuit 14 directly or via an optical coupler circuit.

In the related art, a power supply device for charging a device to be charged is proposed. The power supply device works in a constant voltage mode. In the constant voltage mode, the output voltage of the power supply device basically keeps constant, for example, 5V, 9V, 12V, or 20V, or the like.

The output voltage of the power supply device is not suitable for being directly applied to both ends of the battery of the device to be charged, and needs to be first converted by the conversion circuit in the device to be charged, such that a charging voltage and/or a charging current expected by the battery in the device to be charged are obtained.

The conversion circuit may be configured to convert the output voltage of the power supply device, to meet a requirement of the charging voltage and/or charging current expected by the battery.

As an example, the conversion circuit may be a charging management module, such as a charging integrated circuit (IC). During a charging process of the battery, the conversion circuit may be configured to manage the charging voltage and/or charging current of the battery.

The conversion circuit may have at least one of a voltage feedback function and/or a current feedback function, so as to manage the charging voltage and/or charging current of the battery.

For example, the charging process of the battery may include one or more of a trickle charging stage, a constant current charging stage and a constant voltage charging stage. In the trickle charging stage, the conversion circuit may utilize a current feedback loop to ensure that a current flowing into the battery in the trickle charging stage meets the charging current (such as a first charging current) expected by the battery In the constant current charging stage, the conversion circuit may utilize a current feedback loop to ensure that the current flowing into the battery in the constant current charging stage meets the charging current (such as a second charging current, which may be greater than the first charging current) expected by the battery. In the constant voltage charging stage, the conversion circuit may utilize a voltage feedback loop to ensure that a voltage applied to both ends of the battery in the constant voltage charging stage meets the charging voltage expected by the battery.

As an example, when the output voltage of the power supply device is greater than the charging voltage expected by the battery, the conversion circuit may be configured to perform a buck conversion on the output voltage of the power supply device to enable a buck-converted charging voltage to meet the requirement of the charging voltage expected by the battery. As another example, when the output voltage of the power supply device is less than the charging voltage expected by the battery, the conversion circuit may be configured to perform a boost conversion on the output voltage of the power supply device to enable a boost-converted charging voltage to meet the requirement of the charging voltage expected by the battery.

As another example, assume that the power supply device outputs a constant voltage of 5V. When the battery includes a single battery cell (such as a lithium battery cell, a charging cut-off voltage of a single battery cell is typically 4.2V), the conversion circuit (for example, a buck circuit) may perform a buck conversion on the output voltage of the power supply device, such that the charging voltage obtained after the buck conversion meets a requirement of the charging voltage expected by the battery.

As yet another example, assume that the power supply device outputs a constant voltage of 5V. When the power supply device charges the battery including two or more battery cells (such as lithium battery cell, a charging cut-off voltage of a single battery cell is typically 4.2V) coupled in series, the conversion circuit (for example, a boost circuit) may perform a boost conversion on the output voltage of the power supply device, such that the charging voltage obtained after the boost conversion meets a requirement of the charging voltage expected by the battery.

Limited by a poor conversion efficiency of the conversion circuit, a part of electric energy is lost in a form of heat, and the heat may gather inside the device to be charged. A design space and a space for heat dissipation of the device to be charged are small (for example, the physical size of a mobile terminal used by a user becomes thinner and thinner, while plenty of electronic elements are densely arranged in the mobile terminal to improve performance of the mobile terminal), which not only increases difficulty in designing the conversion circuit, but also results in that it is hard to dissipate the heat gathered in the device to be charged in time, thus further causing an abnormality of the device to be charged.

For example, the heat gathered on the conversion circuit may cause a thermal interference on electronic elements neighboring the conversion circuit, thus causing abnormal operations of the electronic elements. For another example, the heat gathered on the conversion circuit may shorten the service life of the conversion circuit and neighboring electronic elements. For yet another example, the heat gathered on the conversion circuit may cause a thermal interference on the battery, thus causing abnormal charging and/or abnormal discharging of the battery. For still another example, the heat gathered on the conversion circuit may increase the temperature of the device to be charged, thus affecting user experience during the charging. For still yet another example, the heat gathered on the conversion circuit may short-circuit the conversion circuit, such that the output voltage of the power supply device is directly applied to both ends of the battery, thus causing abnormal charging of the battery, which brings safety hazard if the over-voltage charging lasts for a long time, for example, the battery may explode.

In contrast to the power supply device provided in the related art, the power supply device 1 according to embodiments of the present disclosure may be a power supply device whose output voltage is adjustable. The power supply device 1 may obtain status information of the battery. The status information of the battery may include present electric quantity information and/or voltage information of the battery. The power supply device 1 may adjust the output voltage of the power supply device 1 itself according to he obtained status information of the battery, to meet the requirement of the charging voltage and/or charging current expected by the battery. The voltage outputted by the power supply device 1 after adjustment may be directly applied to both ends of the battery for charging the battery (hereinafter, referred to as "direct charging"). Further, during the constant current charging stage of the process of charging the battery, the voltage outputted by the power supply device 1 after adjustment may be directly applied to both ends of the battery for charging the battery.

The power supply device 1 may have a voltage feedback function and a current feedback function, so as to manage the charging voltage and/or charging current of the battery.

The power supply device 1 adjusting the output voltage of the power supply device 1 itself according to the obtained status information of the battery may mean that, the power supply device 1 may obtain the status information of the battery in real time, and adjust the output voltage of the power supply device 1 itself according to the obtained real-time status information of the battery, to meet the charging voltage and/or charging current expected by the battery.

The power supply device 1 adjusting the output voltage of the power supply device 1 itself according to the obtained real-time status information of the battery may mean that, as the voltage of the battery continuously increases during the charging process, the power supply device 1 may obtain the present status information of the battery at different time points in the charging process, and adjust the output voltage of the power supply device 1 itself in real time according to the present status information of the battery, to meet the requirement of the charging voltage and/or charging current expected by the battery.

For example, the charging process of the battery may include at least one of a trickle charging stage, a constant current charging stage and a constant voltage charging stage. In the trickle charging stage, the power supply device 1 may output a first charging current in the trickle charging stage to charge the battery, so as to meet the requirement of the charging current expected by the battery. In the constant current charging stage, the power supply device 1 may utilize a current feedback loop to ensure that the current outputted by the power supply device 1 and flowing into the battery in the constant current charging stage meets the requirement of the charging current expected by the battery. In the constant voltage charging stage, the power supply device 1 may utilize a voltage feedback loop to ensure that a voltage outputted from the power supply device 1 to the device to be charged in the constant voltage charging stage (i.e., the constant direct voltage) keeps constant.

For example, the power supply device 1 mentioned in embodiments of the present disclosure may be mainly configured to control the constant current charging stage of the battery in the device to be charged. In other embodiments, the trickle charging stage and the constant voltage charging stage of the battery in the device to be charged may also be completed cooperatively by the power supply device 1 and an additional charging chip in the device to be charged. Compared to that in the constant current charging stage, the charging power accepted by the battery in the trickle charging stage and the constant voltage charging stage is less, and the efficiency conversion loss and the heat accumulation of the charging chip in the device to be charged is acceptable. It should be noted that, the constant current charging stage or the constant current stage mentioned in embodiments of the present disclosure may refer to a charging mode in which the output current of the power supply device 1 is controlled, and does not require the output current of the power supply device 1 to keep completely constant and unchanged. In practice, the power supply device 1 typically performs charging by means of multi-stage constant current charging in the constant current charging stage.

The multi-stage constant current charging may include N constant current stages, where N is an integer no less than 2. The first charging stage of the multi-stage constant current charging starts with a predetermined charging current. N constant current stages in the multi-stage constant current charging are performed in sequence from the first charging stage to the $(N-1)^{th}$ charging stage. After the constant current charging is switched from one constant current stage to the next constant current stage, the peak value of the current may be decreased. When the battery voltage reaches a charging stop voltage threshold, the constant current charging is switched from the present constant current stage to the next constant current stage. The current change between two adjacent constant current stages may be gradual, or may be in a stepped skip manner.

The device to be charged used in embodiments of the present disclosure may refer to the "terminal". The "terminal" may include, but is not limited to a device configured to receive/transmit communication signals via a wired connection (for example, public switched telephone network (PSTN), digital subscriber line (DSL) connection, digital cable connection, direct cable connection and/or another data connection/network) and/or via a wireless interface (for example, cellular network, wireless local area network (WLAN), digital TV network such as digital video broadcasting handheld (DVB-H) network, satellite network, an amplitude modulation-frequency modulation (AM-FM) broadcasting transmitter, and/or a wireless interface of another communication terminal). The communication terminal configured to communicate via the wireless interface may be referred to as "wireless communication terminal", "wireless terminal" and/or "mobile terminal". Examples of a mobile terminal include, but are not limited to a satellite phone or a cell phone, a terminal combining a cell radio phone and a personal communication system (PCS) having capability of data process, fax, and data communication, a personal digital assistant (PDA) including a radio phone, a pager, Internet/Intranet access, a web browser, a note pad & address book, a calendar and/or a global positioning system (GPS) receiver, and a common laptop and/or handheld receiver, or other electronic devices including a radio phone transceiver. In addition, the device to be charged or terminal used in embodiments of the present disclosure may further include a power bank. The power bank may receive charging from the power supply device 1, and store the energy, for providing power for other electronic devices.

Figure 3:
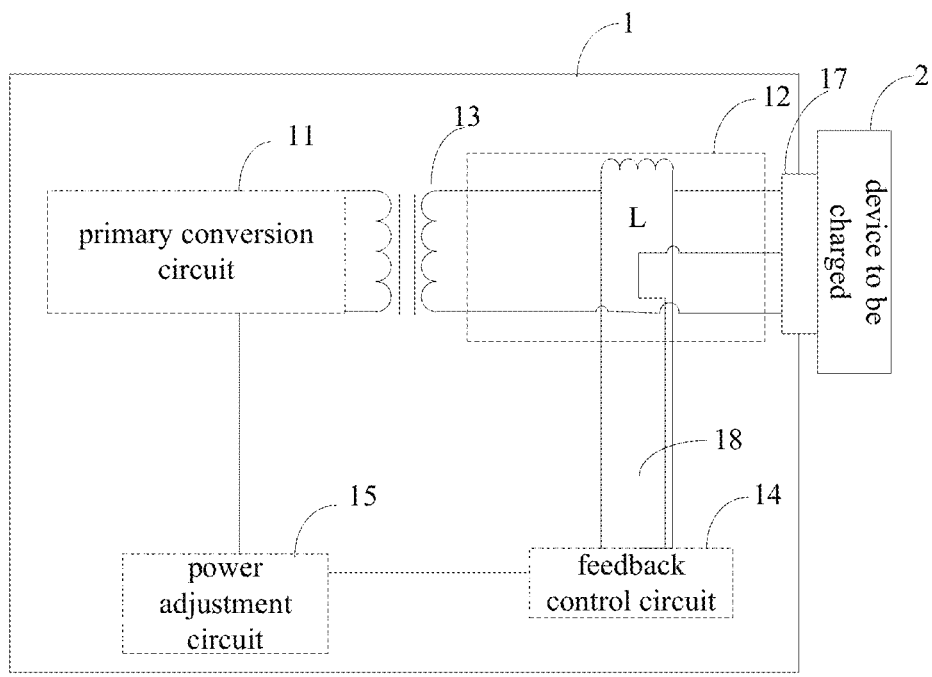
FIG. 3 is a schematic diagram of a charging system according to an embodiment of the present disclosure.

Referring to FIG. 3, in some embodiments, the feedback control circuit 14 may be further configured to communicate with the device to be charged 2, to control the output of the power supply device 1, such that the output voltage and/or the output current of the power supply device 1 matches the present charging stage of the battery (not illustrated in FIG. 3) of the device to be charged 2.

In detail, the power supply device 1 may include a charging interface 17. The feedback control circuit 14 may perform bidirectional communication with the device to be charged 2 via a data wire 18 of the charging interface 17. A type of the above charging interface is not limited in embodiments of the present disclosure. For example, the charging interface may be a USB (universal serial bus) interface. The USB interface may be, for example, a USB 2.0 interface, a micro USB interface, or a USB TYPE-C interface. For another example, the charging interface may also be a lightning interface, or any other type of parallel port of serial port that can be used for charging.

In some embodiments, the power supply device 1 supports a first charging mode and a second charging mode, and a charging speed of the power supply device 1 in the second charging mode is greater than a charging mode of the power supply device 1 in the first charging mode. In other words, compared to the power supply device 1 working in the first charging mode, the power supply device 1 working in the second charging mode may take a shorter time to fully charge the battery with a same capacity in the device to be charged. The first charging mode may be a normal charging mode, and the second charging mode may be a fast charging mode. The normal charging mode may refer to a charging mode in which the power supply device 1 outputs a relatively smaller current value (typically less than 2.5A) or charges the battery in the device to be charged with a relatively smaller power (typically less than 15W). In the normal charging mode, it typically takes several hours to fully fill a larger capacity battery (such as a battery with 3000 mAh). However, in the fast charging mode, the power supply device 1 can output a relatively large current (typically greater than 2.5A, such as 4.5A, 5A or higher) or charges the battery in the device to be charged with a relatively large power (typically greater than or equal to 15W). Compared to the normal charging mode, the period of time may be significantly shortened when the battery with the same capacity is fully filled by the power supply device 1 in the fast charging mode, and the charging is faster.

The feedback control circuit 14 communicating with the device to be charged to control the output of the power supply device 1 may include: the feedback control circuit 14 communicating with the device to be charged 2 to control the output of the power supply device 1 in the second charging mode.

The communicated content between the feedback control circuit of the power supply device 1 and the device to be charged is not limited in embodiments of the present disclosure, and the control method of the feedback control circuit 14 on the output of the power supply device 1 in the second charging mode is also not limited in embodiments of the present disclosure. For example, the feedback control circuit 14 may communicate with the device to be charged 2 to obtain the present voltage or present electric quantity of the battery in the device to be charged 2, and adjust the output voltage or output current of the power supply device 1 based on the present voltage or present electric quantity of the battery. In the following, the communicated content between the feedback control circuit 14 and the device to be charged 2 and the control method of the feedback control circuit 14 on the output of the power supply device 1 in the second charging mode will be described in detail in combination with specific embodiments.

The master-slave relation of the power supply device 1 (or the feedback control circuit 14 in the power supply device 1) and the device to be charged 2 is not limited in embodiments of the present disclosure. In other words, any of the feedback control circuit 14 and the device to be charged 2 can be configured as the master device for initiating the bidirectional communication session, accordingly, the other one can be configured as the slave device for making a first response or a first reply to the communication initiated by the master device. As a feasible implementation, during the communication, the identities of the master device and the slave device can be determined by comparing the electrical levels of the power supply device 1 and the device to be charged 2 relative to the ground.

The specific implementation of bidirectional communication between the power supply device 1 (or the feedback control circuit 14 of the power supply device 1) and the device to be charged 2 is not limited in embodiments of the present disclosure. In other words, any of the power supply device 1 (or the feedback control circuit 14 of the power supply device 1) and the device to be charged 2 can be configured as the master device for initiating the communication session, accordingly, the other one can be configured as the slave device making a first response or a first reply to the communication session initiated by the master device, and the master device is able to make a second response to the first response or the first reply of the slave device, and thus a negotiation about a charging mode can be realized between the master device and the slave device. As a feasible implementation, a charging operation between the master device and the slave device is performed after a plurality of negotiations about the charging mode are completed between the master device and the slave device, such that the charging process can be performed safely and reliably after the negotiation.

As an implementation, the mater device is able to make a second response to the first response or the first reply made by the slave device to the communication session in a manner that, the master device is able to receive the first response or the first reply made by the slave device to the communication session and to make a targeted second response to the first response or the first reply. As an example, when the master device receives the first response or the first reply made by the slave device to the communication session in a predetermined time period, the master device makes the targeted second response to the first response or the first reply of the slave device in a manner that, the master device and the slave device complete one negotiation about the charging mode, and a charging process may be performed between the master device and the slave device in the first charging mode or the second charging mode, i.e., the power supply device 1 charges the device to be charged 2 in the first charging mode or the second charging mode according to a negotiation result.

As another implementation, the mater device is able to make a second response to the first response or the first reply made by the slave device to the communication session in a manner that, when the master device does not receive the first response or the first reply made by the slave device to the communication session in the predetermined time period, the mater device also makes the targeted second response to the first response or the first reply of the slave device. As an example, when the master device does not receive the first response or the first reply made by the slave device to the communication session in the predetermined time period, the master device makes the targeted second response to the first response or the first reply of the slave device in a manner that, the master device and the slave device complete one negotiation about the charging mode, and the charging process is performed between the mater device and the slave device in the first charging mode, i.e., the power supply device 1 charges the device to be charged 2 in the first charging mode.

In some embodiments, when the device to be charged 2 is configured as the master device for initiating the communication session, after the power supply device 1 (or the feedback control circuit 14 of the power supply device 1) configured as the slave device makes the first response or the first reply to the communication session initiated by the master device, it is unnecessary for the device to be charged 2 to make the targeted second response to the first response or the first reply of the power supply device 1, i.e., one negotiation about the charging mode is regarded as completed between the power supply device 1 (or the feedback control circuit 14 of the power supply device 1) and the device to be charged 2, and the power supply device 1 is able to charge the device to be charged 2 in the first charging mode or the second charging mode according to the negotiation result.

In some embodiments, the feedback control circuit 14 may communicate with the device to be charged 2 to control the output of the power supply device 1 in the second charging mode as follows. The feedback control circuit 14 performs the bidirectional communication with the device to be charged 2 to negotiate the charging mode between the power supply device 1 and the device to be charged 2.

In some embodiments, the feedback control circuit 14 may perform the bidirectional communication with the device to be charged 2 to negotiate the charging mode between the power supply device 1 and the device to be charged 2 as follows. The feedback control circuit 14 sends a first instruction to the device to be charged 2, in which the first instruction is configured to query the device to be charged 2 whether to operate in the second charging mode. The feedback control circuit 14 receives a reply instruction of to the first instruction sent by the device to be charged 2, in which the reply instruction of the first instruction is configured to indicate whether the device to be charged 2 agrees to operate in the second charging mode. When the device to be charged 2 agrees to operate in the second charging mode, the feedback control circuit 14 charges the device to be charged 2 in the second charging mode.

In embodiments of the present disclosure, the power supply device 1 does not perform a fast charging on the device to be charged 2 in the second charging mode blindly, but performs the bidirectional communication with the device to be charged 2 to negotiate whether the power supply device 1 can perform the fast charging on the device to be charged 2 in the second charging mode. In this way, safety of charging process can be improved.

In some embodiments, the feedback control circuit 14 may perform the bidirectional communication with the device to be charged 2 to control the output of the power supply device 1 in the second charging mode as follows. The feedback control circuit 14 performs the bidirectional communication with the device to be charged 2 to determine a charging voltage outputted by the power supply device 1 in the second charging mode for charging the device to be charged 2. The feedback control circuit 14 adjusts the output voltage of the power supply device 1, such that the output voltage of the power supply device 1 is equal to the charging voltage outputted by the power supply device 1 in the second charging mode for charging the device to be charged 2.

In some embodiments, the feedback control circuit 14 may perform the bidirectional communication with the device to be charged 2 to determine the charging voltage outputted by the power supply device 1 in the second charging mode for charging the device to be charged 2 as follows. The feedback control circuit 14 sends a second instruction to the device to be charged 2, in which the second instruction is configured to query whether the output voltage of the power supply device 1 matches the present voltage of the battery in the device to be charged 2. The feedback control circuit 14 receives a reply instruction of the second instruction sent by the device to be charged 2, in which the reply instruction of the second instruction is configured to indicate that the output voltage of the power supply device 1 matches the present voltage of the battery, or is higher or lower than the present voltage of the battery.

In other embodiments, the second instruction can be configured to query whether the present output voltage of the power supply device 1 is suitable for being used as the charging voltage outputted by the power supply device 1 in the second charging mode for charging the device to be charged 2, and the reply instruction of the second instruction can be configured to indicate the present output voltage of the power supply device 1 is suitable, high or low. When the present output voltage of the power supply device 1 matches the present voltage of the battery or the present output voltage of the power supply device 1 is suitable for being used as the charging voltage outputted by the power supply device 1 in the second charging mode for charging the device to be charged 2, it indicates that the present output voltage of the power supply device 1 may be slightly higher than the present voltage of the battery, and a difference between the output voltage of the power supply device 1 and the present voltage of the battery is within a predetermined range (typically in an order of hundreds of millivolts).

In some embodiments, the feedback control circuit 14 may perform the bidirectional communication with the device to be charged 2 to control the output of the power supply device 1 in the second charging mode as follows. The feedback control circuit 14 performs the bidirectional communication with the device to be charged 2 to determine the charging current outputted by the power supply device 1 in the second charging mode for charging the device to be charged 2. The feedback control circuit 14 adjusts the output current of the power supply device 1, such that the output current of the power supply device 1 is equal to the charging current outputted by the power supply device 1 in the second charging mode for charging the device to be charged 2.

In some embodiments, the feedback control circuit 14 may perform the bidirectional communication with the device to be charged 2 to determine the charging current outputted by the power supply device 1 in the second charging mode for charging the device to be charged 2 as follows. The feedback control circuit 14 sends a third instruction to the device to be charged 2, in which the third instruction is configured to query a maximum charging current presently supported by the device to be charged 2. The feedback control circuit 14 receives a reply instruction of the third instruction sent by the device to be charged 2, in which the reply instruction of the third instruction is configured to indicate the maximum charging current presently supported by the device to be charged 2. The feedback control circuit 14 determines the charging current outputted by the power supply device 1 in the second charging mode for charging the device to be charged 2 according to the maximum charging current presently supported by the device to be charged 2.

It should be understood that, the feedback control circuit 14 can determine the charging current outputted by the power supply device 1 in the second charging mode for charging the device to be charged 2 according to the maximum charging current presently supported by the device to be charged 2 in many ways. For example, the power supply device 1 can determine the maximum charging current presently supported by the device to be charged 2 as the charging current outputted by the power supply device 1 in the second charging mode for charging the device to be charged 2, or can determine the charging current outputted by the power supply device 1 in the second charging mode for charging the device to be charged 2 after comprehensively considering factors such as the maximum charging current presently supported by the device to be charged 2 and its own current output capability.

In some embodiments, the feedback control circuit 14 may perform the bidirectional communication with the device to be charged 2 to control the output of the power supply device 1 in the second charging mode as follows. During a charging process in the second charging mode, the feedback control circuit 14 performs the bidirectional communication with the device to be charged 2 to adjust the output current of the power supply device 1, such that the output current of the power supply device 1 matches the charging current expected by the battery in the present charging stage.

In some embodiments, the feedback control circuit 14 may perform the bidirectional communication with the device to be charged 2 to adjust the output current of the power supply device 1 as follows. The feedback control circuit 14 sends a fourth instruction to the device to be charged 2, in which the fourth instruction is configured to query a present voltage of the battery in the device to be charged 2. The feedback control circuit 14 receives a reply instruction of the fourth instruction sent by the device to be charged 2, in which the reply instruction of the fourth instruction is configured to indicate the present voltage of the battery. The feedback control circuit 14 determines the charging current expected by the battery in the present charging stage according to the present voltage of the battery. The feedback control circuit 14 adjusts the output current of the power supply device 1, such that the output current of the power supply device 1 matches the charging current expected by the battery in the present charging stage.

In some embodiments, the feedback control circuit 14 may perform the bidirectional communication with the device to be charged 2 to control the output of the power supply device 1 in the second charging mode as follows. The feedback control circuit 14 performs the bidirectional communication with the device to be charged 2 to determine whether the charging interface is in poor contact.

In detail, the feedback control circuit 14 may perform the bidirectional communication with the device to be charged 2 to determine whether the charging interface is in poor contact as follows. The feedback control circuit 14 sends the fourth instruction to the device to be charged 2, in which the fourth instruction is configured to query the present voltage of the battery in the device to be charged 2. The feedback control circuit 14 receives the reply instruction of the fourth instruction sent by the device to be charged 2, in which the reply instruction of the fourth instruction is configured to indicate the present voltage of the battery in the device to be charged 2. The feedback control circuit 14 determines whether the charging interface is in poor contact according to the output voltage of the power supply device 1 and the present voltage of the battery in the device to be charged 2. For example, when the feedback control circuit 14 determines a difference between the output voltage of the power supply device 1 and the present voltage of the battery in the device to be charged 2 is greater than a predetermined voltage threshold, it indicates that an impedance obtained by dividing the voltage difference by the present current value outputted by the power supply device 1 is greater than a preset impedance threshold, and thus it can be determined that the charging interface is in poor contact.

In some embodiments, it can be determined by the device to be charged 2 whether the charging interface is in poor contact. For example, the device to be charged 2 sends a sixth instruction to the feedback control circuit 14, in which the sixth instruction is configured to query the output voltage of the power supply device 1. The device to be charged 2 receives a reply instruction of the sixth instruction sent by the feedback control circuit 14, in which the reply instruction of the sixth instruction is configured to indicate the output voltage of the power supply device 1. The device to be charged 2 determines whether the charging interface is in poor contact according to the output voltage of the power supply device 1 and the present voltage of the battery in the device to be charged 2. After the device to be charged 2 determines that the charging interface is in poor contact, the device to be charged 2 may send a fifth instruction to the control unit, in which the fifth instruction is configured to indicate that the charging interface is in poor contact. After receiving the fifth instruction, the feedback control circuit 14 can control the power supply device 1 to quit the second charging mode.

Figure 4:
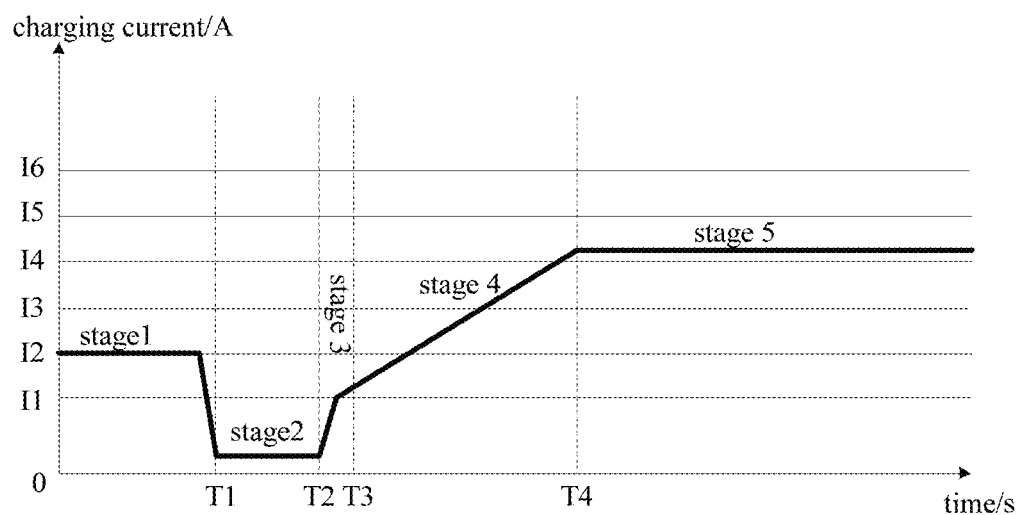
FIG. 4 is a schematic diagram illustrating a communication procedure between a power supply device and a device to be charged according to an embodiment of the present disclosure.

With reference to FIG. 4, the communication procedure between the power supply device 1 and the device to be charged 2 will be described in detail. It should be noted that, examples in FIG. 4 are merely used to help those skilled in the related art to understand embodiments of the present disclosure. The embodiments shall not be limited to the specific numeric values or specific scenes. Apparently, various modifications and equivalents can be made by those skilled in the related art based on examples in FIG. 4, and those modifications and equivalents shall fall within the protection scope of the present disclosure.

As illustrated in FIG. 4, the communication procedure between the power supply device 1 and the device to be charged 2 (or, referred to as the communication procedure of the fast charging) may include the following five stages.

Stage 1:

After the device to be charged 2 is coupled to a power supply device, the device to be charged 2 may detect a type of the power supply device via the data wires D+ and D−. When detecting that the power supply device is the power supply device 1 according to embodiments of the present disclosure, the device to be charged 2 may absorb current greater than a predetermined current threshold 12 (which may be, for example, 1A). When the power supply device 1 detects that the output current of the power supply device 1 is greater than or equal to 12 for a predetermined time period (for example, may be a continuous time period T1), the power supply device 1 determines that the device to be charged 2 has completed the recognition of the type of the power supply device. Then, the power supply device 1 initiates a negotiation with the device to be charged 2, and sends an instruction 1 (corresponding to the above-mentioned first instruction) to the device to be charged 2 to query whether the device to be charged 2 agrees that the power supply device 1 charges the device to be charged 2 in the second charging mode.

When the power supply device 1 receives a reply instruction of the instruction 1 sent by the device to be charged 2 and the reply instruction of the instruction 1 indicates that the device to be charged 2 disagrees that the power supply device 1 charges the device to be charged 2 in the second charging mode, the power supply device 1 detects the output current of the power supply device 1 again. When the output current of the power supply device 1 is still greater than or equal to 12 within a predetermined continuous time period (for example, may be a continuous time period T1), the power supply device 1 sends the instruction 1 again to the device to be charged 2 to query whether the device to be charged 2 agrees that the power supply device 1 charges the device to be charged 2 in the second charging mode. The power supply device 1 repeats the above actions in stage 1, until the device to be charged 2 agrees that the power supply device 1 charges the device to be charged 2 in the second charging mode or until the output current of the power supply device 1 is no longer greater than or equal to 12.

After the device to be charged 2 agrees that the power supply device 1 charges the device to be charged 2 in the second charging mode, the communication procedure goes into stage 2

Stage 2:

For the output voltage of the power supply device 1, there may be several levels. The power supply device 1 sends an instruction 2 (corresponding to the above-mentioned second instruction) to the device to be charged 2 to query whether the output voltage of the power supply device 1 (the present output voltage) matches the present voltage of the battery in the device to be charged 2.

The device to be charged 2 sends a reply instruction of the instruction 2 to the power supply device 1, for indicating that the output voltage of the power supply device 1 matches the present voltage of the battery in the device to be charged 2, or is higher or lower than the present voltage of the battery in the device to be charged 2. When the reply instruction of the instruction 2 indicates that the output voltage of the power supply device 1 is higher or lower, the power supply device 1 adjusts the output voltage of the power supply device 1 by one level, and sends the instruction 2 to the device to be charged 2 again to query whether the output voltage of the power supply device 1 matches the present voltage of the battery. The above actions in stage 2 are repeated, until the device to be charged 2 determines that the output voltage of the power supply device 1 matches the present voltage of the battery in the device to be charged 2. Then, the communication procedure goes into stage 3.

Stage 3:

The power supply device 1 sends an instruction 3 (corresponding to the above-mentioned third instruction) to the device to be charged 2 to query the maximum charging current presently supported by the device to be charged 2. The device to be charged 2 sends a reply instruction of the instruction 3 to the power supply device 1 for indicating the maximum charging current presently supported by the device to be charged 2, and then the communication procedure goes into stage 4.

Stage 4:

The power supply device 1 determines the charging current outputted by the power supply device 1 in the second charging mode for charging the device to be charged 2 according to the maximum charging current presently supported by the device to be charged 2. Then, the communication procedure goes into stage 5, i.e., the constant current charging stage.

Stage 5:

When the communication procedure goes into the constant current charging stage, the power supply device 1 may send an instruction 4 (corresponding to the above-mentioned fourth instruction) to the device to be charged 2 at intervals to query the present voltage of the battery in the device to be charged 2. The device to be charged 2 may send a reply instruction of the instruction 4 to the power supply device 1, to feed back the present voltage of the battery. The power supply device 1 may determine according to the present voltage of the battery whether the charging interface is in poor contact and whether it is necessary to decrease the output current of the power supply device 1. When the power supply device 1 determines that the charging interface is in poor contact, the power supply device 1 may send an instruction 5 (corresponding to the above-mentioned fifth instruction) to the device to be charged 2, and the power supply device 1 would quit the second charging mode, and then the communication procedure is reset and goes into stage 1 again.

In some embodiments, in stage 1, when the device to be charged 2 sends the reply instruction of the instruction 1, the reply instruction of the instruction 1 may carry data (or information) of the path impedance of the device to be charged 2. The data of the path impedance of the device to be charged 2 may be used in stage 5 to determine whether the charging interface is in poor contact.

In some embodiments, in stage 2, the time period from when the device to be charged 2 agrees the power supply device 1 to charge the device to be charged 2 in the second charging mode to when the power supply device 1 adjusts the output voltage of the power supply device 1 to a suitable charging voltage may be controlled in a certain range. If the time period exceeds a predetermined range, the power supply device 1 or the device to be charged 2 may determine that the communication procedure is abnormal, such that the communication procedure is reset and goes into stage 1.

In some embodiments, in stage 2, when the output voltage of the power supply device 1 is higher than the present voltage of the battery in the device to be charged 2 by $\Delta V$ ($\Delta V$ may be set to 200-500 mV), the device to be charged 2 may send a reply instruction of the instruction 2 to the power supply device 1, for indicating that the output voltage of the power supply device 1 matches the voltage of the battery in the device to be charged 2.

In some embodiments, in stage 4, the adjusting speed of the output current of the power supply device 1 may be controlled to be in a certain range, thus avoiding an abnormity occurring in the charging process due to the too fast adjusting speed.

In some embodiments, in stage 5, the variation degree of the output current of the power supply device 1 may be controlled to be less than or equal to 5%.

In some embodiments, in stage 5, the power supply device 1 can monitor the path impedance of a charging loop in real time. In detail, the power supply device 1 can monitor the path impedance of the charging loop according to the output voltage of the power supply device 1, the output current of the power supply device 1 and the present voltage of the battery fed back by the device to be charged 2. When the path impedance of the charging loop is greater than a sum of the path impedance of the device to be charged 2 and the impedance of the charging wire, it may be considered that the charging interface is in poor contact, and thus the power supply device 1 stops charging the device to be charged 2 in the second charging mode.

In some embodiments, after the power supply device 1 starts to charge the device to be charged 2 in the second charging mode, time intervals of communications between the power supply device 1 and the device to be charged 2 may be controlled to be in a certain range, thus avoiding abnormity in the communication procedure due to the too short time interval of communications.

In some embodiments, the stop of the charging process (or the stop of the charging process that the power supply device 1 charges the device to be charged 2 in the second charging mode) may be a recoverable stop or an unrecoverable stop.

For example, when it is detected that the battery in the device to be charged 2 is fully charged or the charging interface is poor contact, the charging process is stopped and the charging communication procedure is reset, and the charging process goes into stage 1 again. Then, the device to be charged 2 disagrees that the power supply device 1 charges the device to be charged 2 in the second charging mode, and the communication procedure would not go into stage 2. The stop of the charging process in such a case may be considered as an unrecoverable stop.

For another example, when an abnormity occurs in the communication between the power supply device 1 and the device to be charged 2, the charging process is stopped and the charging communication procedure is reset, and the charging process goes into stage 1 again. After requirements for stage 1 are met, the device to be charged 2 agrees that the power supply device 1 charges the device to be charged 2 in the second charging mode to recover the charging process. In this case, the stop of the charging process may be considered as a recoverable stop.

For another example, when the device to be charged 2 detects that an abnormity occurs in the battery, the charging process is stopped and the charging communication process is reset, and the charging process goes into stage 1 again. The device to be charged 2 then disagrees that the power supply device 1 charges the device to be charged 2 in the second charging mode. When the battery returns to normal and the requirements for stage 1 are met, the device to be charged 2 agrees that the power supply device 1 charges the device to be charged 2 in the second charging mode. In this case, the stop of fast charging process may be considered as a recoverable stop.

Communication actions or operations illustrated in FIG. 4 are merely exemplary. For example, in stage 1, after the device to be charged 2 is coupled to the power supply device 1, the handshake communication between the device to be charged 2 and the power supply device 1 may be initiated by the device to be charged 2. In other words, the device to be charged 2 sends an instruction 1 to query the power supply device 1 whether to operate in the second charging mode. When the device to be charged 2 receives a reply instruction indicating that the power supply device 1 agrees to charge the device to be charged 2 in the second charging mode from the power supply device 1, the power supply device 1 starts to charge the battery in the device to be charged 2 in the second charging mode.

For another example, after stage 5, there may be a constant voltage charging stage. In detail, in stage 5, the device to be charged 2 may feedback the present voltage of the battery to the power supply device 1. The charging process goes into the constant voltage charging stage from the constant current charging stage when the present voltage of the battery reaches a voltage threshold for constant voltage charging. During the constant voltage charging stage, the charging current decreases gradually. When the current reduces to a certain threshold, it indicates that the battery in the device to be charged 2 is fully charged, and the whole charging process is stopped.

The device embodiments of the present disclosure have been described above in detail with reference to FIGS. 1-4. The method embodiments of the present disclosure will be described below in detail with reference to FIG. 5. It should be understood that, the description of method embodiments corresponds to the description of device embodiments, and thus some repeated description is omitted for simplicity.

Figure 5:
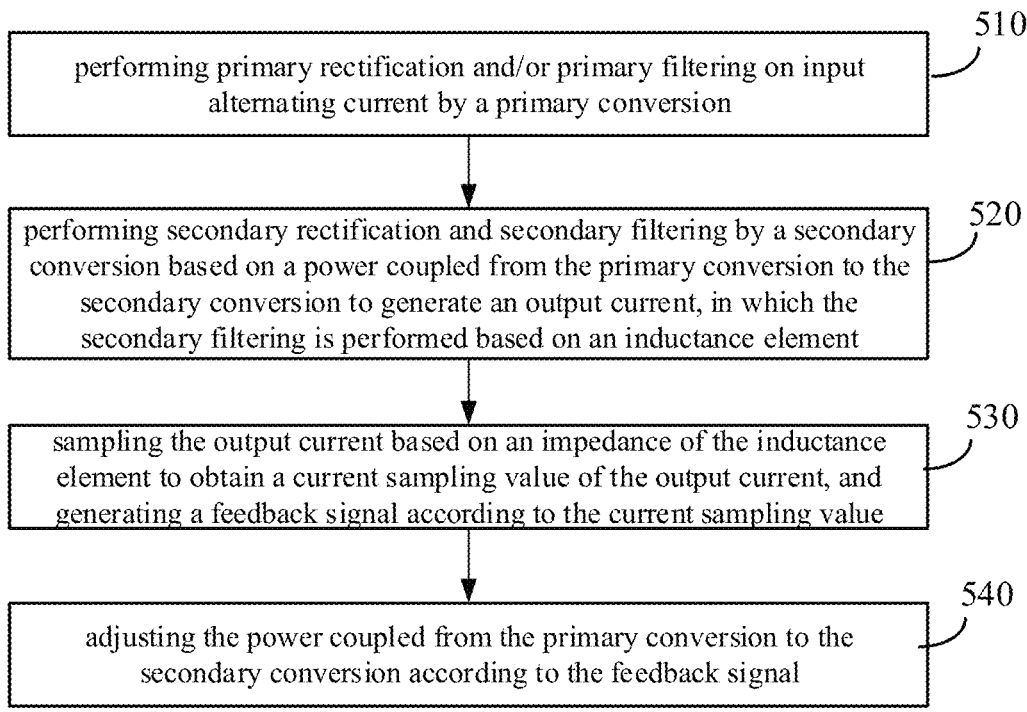
FIG. 5 is a schematic flow chart of a charging control method according to an embodiment of the present disclosure.

FIG. 5 is a schematic flow chart of a charging control method according to an embodiment of the present disclosure. The charging control method illustrated in FIG. 5 may include the followings.

At block 510, primary rectification and/or primary filtering is performed by a primary conversion on input alternating current.

At block 520, secondary rectification and secondary filtering is performed by a secondary conversion based on a power coupled from the primary conversion to the secondary conversion to generate an output current, in which the secondary filtering is performed based on an inductance element.

At block 530, the output current is sampled based on an impedance of the inductance element to obtain a current sampling value of the output current, and a feedback signal is generated according to the current sampling value.

At block 540, the power coupled from the primary conversion to the secondary conversion is adjusted according to the feedback signal.

Figure 6:
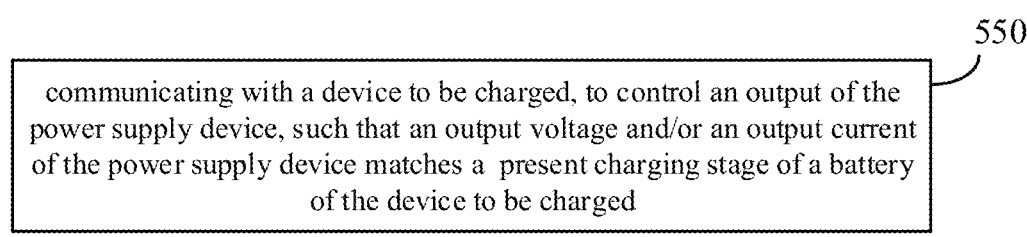
FIG. 6 is a schematic flow chart of a charging control method according to another embodiment of the present disclosure.

The charging control method is applicable to a power supply device, and the charging control method may further include the followings, as illustrated in FIG. 6.

At block 550, communication with the device to be charged is performed, to control an output of the power supply device, such that an output voltage and/or an output current of the power supply device matches a present charging stage of a battery of the device to be charged.

In some embodiments, the power supply device supports a first charging mode and a second charging mode, and a charging speed of the power supply device in the second charging mode is greater than a charging speed of the power supply device in a first charging mode, and block 550 may include: communicating with the device to be charged to control the output of the power supply device in the second charging mode.

In some embodiments, communicating with the device to be charged to control the output of the power supply device may include: performing bidirectional communication with the device to be charged to negotiate a charging mode between the power supply device and the device to be charged.

In some embodiments, performing bidirectional communication with the device to be charged to negotiate the charging mode between the power supply device and the device to be charged may include: sending a first instruction to the device to be charged, the first instruction being configured to query the device to be charged whether to operate in the second charging mode; receiving a reply instruction of the first instruction sent by the device to be charged, the reply instruction of the first instruction being configured to indicate whether the device to be charged agrees to operate in the second charging mode; and charging the device to be charged in the second charging mode when the device to be charged agrees to operate in the second charging mode.

In some embodiments, block 550 may include: performing bidirectional communication with the device to be charged, to determine a charging voltage outputted by the power supply device in the second charging mode for charging the device to be charged; and adjusting the output voltage of the power supply device, such that the output voltage of the power supply device is equal to the charging voltage outputted by the power supply device in the second charging mode for charging the device to be charged.

In some embodiments, performing bidirectional communication with the device to be charged to determine the charging voltage outputted by the power supply device in the second charging mode for charging the device to be charged may include: sending a second instruction to the device to be charged, the second instruction being configured to query whether the output voltage of the power supply device matches a present voltage of the battery of the device to be charged; and receiving a reply instruction of the second instruction sent by the device to be charged, the reply instruction of the second instruction being configured to indicate that the output voltage of the power supply device matches the present voltage of the battery, is higher than the present voltage of the battery, or is lower than the present voltage of the battery.

In some embodiments, block 550 may include: performing bidirectional communication with the device to be charged, to determine a charging current outputted by the power supply device in the second charging mode for charging the device to be charged; and adjusting the output current of the power supply device, such that the output current of the power supply device is equal to the charging current outputted by the power supply device in the second charging mode for charging the device to be charged.

In some embodiments, performing bidirectional communication with the device to be charged to determine the charging current outputted by the power supply device in the second charging mode for charging the device to be charged may include: sending a third instruction to the device to be charged, the third instruction being configured to query a maximum charging current presently supported by the device to be charged; receiving a reply instruction of the third instruction sent by the device to be charged, the reply instruction of the third instruction being configured to indicate the maximum charging current presently supported by the device to be charge; and determining the charging current outputted by the power supply device in the second charging mode for charging the device to be charged according to the maximum charging current presently supported by the device to be charged.

In some embodiments, block 550 may include: during charging in the second charging mode, performing bidirectional communication with the device to be charged to adjust the output current of the power supply device, such that the output current of the power supply device matches a charging current expected by the battery in the present charging stage.

In some embodiments, performing bidirectional communication with the device to be charged to adjust the output current of the power supply device may include: sending a fourth instruction to the device to be charged, the fourth instruction being configured to query a present voltage of the battery of the device to be charged; receiving a reply instruction of the fourth instruction sent by the device to be charged, the reply instruction of the fourth instruction being configured to indicate the present voltage of the battery; determining the charging current expected by the battery in the present charging stage according to the present voltage of the battery; and adjusting the output current of the power supply device, such that the output current of the power supply device matches the charging current expected by the battery in the present charging stage.

In some embodiments, the power supply device may include a charging interface, and the power supply device may perform the bidirectional communication with the device to be charged via a data wire of the charging interface.

Embodiments of the present disclosure further provide a charging control method of using a power supply device that performs secondary conversion based on an inductance element.

Figure 7:
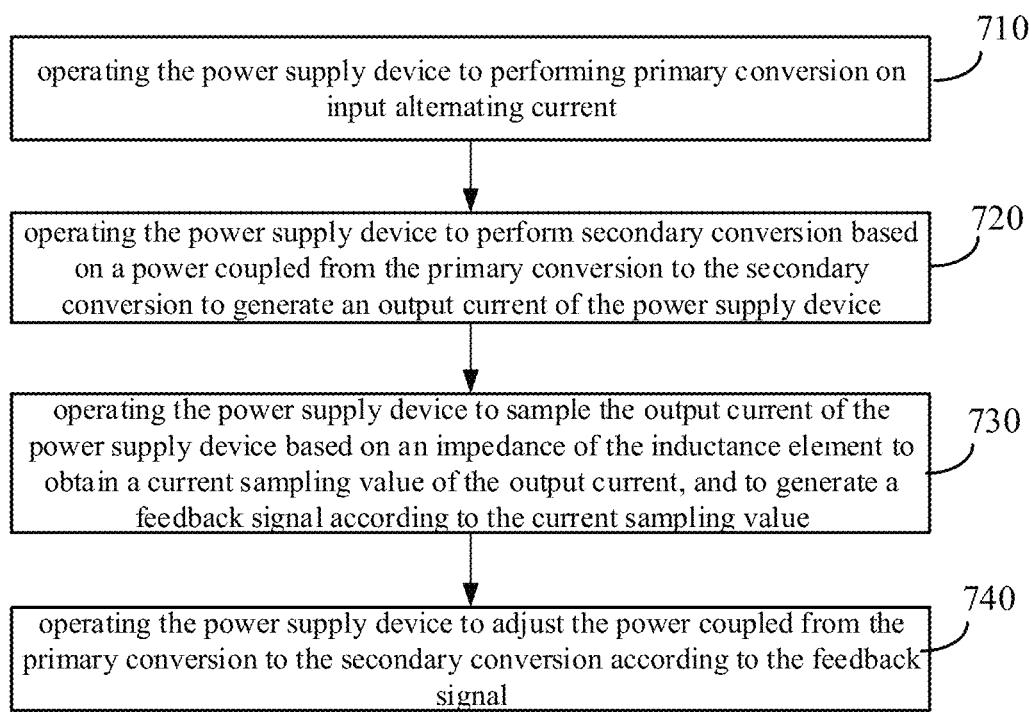
FIG. 7 is a schematic flow chart of a charging control method of using a power supply device that performs secondary conversion based on an inductance element according to an embodiment of the present disclosure.

As illustrated in FIG. 7, the charging control method includes the followings.

At block 710, the power supply device is operated to perform primary conversion on input alternating current.

At block 720, the power supply device is operated to perform secondary conversion based on a power coupled from the primary conversion to the secondary conversion to generate an output current of the power supply device.

At block 730, the power supply device is operated to sample the output current of the power supply device based on an impedance of the inductance element to obtain a current sampling value of the output current of the power supply device, and to generate a feedback signal according to the current sampling value.

At block 740, the power supply device is operated to adjust the power coupled from the primary conversion to the secondary conversion according to the feedback signal.

In above embodiments, it is possible to implement the embodiments fully or partially by software, hardware, firmware or any other combination. When implemented by software, it is possible to implement the embodiments fully or partially in a form of computer program products. The computer program product includes one or more computer instructions. When the computer program instructions are loaded and executed by the computer, procedures or functions according to embodiments of the present disclosure are fully or partially generated. The computer may be a general-purpose computer, a special-purpose computer, a computer network, or any other programmable device. The computer instructions may be stored in a computer readable storage medium, or may be transmitted from one computer readable storage medium to another computer readable storage medium. For example, the computer instructions may be transmitted from one website, computer, server or data center to another website, computer, server or data center in a wired manner (for example, via coaxial cables, fiber optics, or DSL (digital subscriber line)) or in a wireless manner (for example, via infrared, WiFi or microwave). The computer readable storage medium may be any available medium that are accessible by the computer, or a data storage device such as a server or a data center integrated with one or more available medium. The available medium may be magnetic medium (for example, floppy disk, hard disk and tape), optical medium (for example, DVD (digital video disc)), or semiconductor medium (for example, SSD (solid state disk)).

Those skilled in the art could be aware that, exemplary units and algorithm steps described in combination with embodiments disclosed herein may be implemented by electronic hardware, or by a combination of computer software and electronic hardware. Whether these functions are executed by hardware or software is dependent on particular use and design constraints of the technical solutions. Professionals may adopt different methods for different particular uses to implement described functions, which should not be regarded as going beyond the scope of the present disclosure.

In several embodiments provided by the present disclosure, it should be understood that, the disclosed system, device and method may be implemented in other ways. For example, the device embodiments described above are merely illustrative. For example, the units are merely divided according to logic functions, and can be divided in other ways in actual implementation. For example, a plurality of units or components may be combined or may be integrated into another system, or some features may be ignored or not executed. In addition, the mutual coupling or direct coupling or communication connection illustrated or discussed may be via some interfaces, or direct coupling or communication connection of devices or units may be in an electrical, mechanical, or other form.

Units illustrated as separate components may be or may not be physically separated, and components illustrated as units may be or may not be physical units, i.e., may be located at a same place, or may be distributed onto multiple network units. Some or all of the units may be selected to implement the purpose of the solution in an embodiment according to actual demands.

Moreover, respective functional units in respective embodiments of the present disclosure may be integrated in one processing unit, or the respective units may be separate physical existence, or two or more units may be integrated in one unit.

Above description is merely specific implementation of the present disclosure. However, the protection scope of the present disclosure is not limited to this. Any change or substitute that is conceivable by those skilled in the art should be in the protection scope of the present disclosure. Thus, the protection scope of the present disclosure should be defined as the protection scope of claims.

What is claimed is:

1. A power supply device, comprising:
   a primary conversion circuit, a secondary conversion circuit, and a transformer between the primary conversion circuit and the secondary conversion circuit, wherein the primary conversion circuit is configured to perform primary rectification and/or primary filtering on input alternating current, the transformer is configured to couple an output power of the primary conversion circuit to the secondary conversion circuit, the secondary conversion circuit is configured to perform secondary rectification and secondary filtering based on a power coupled from the primary conversion circuit to the secondary conversion circuit to generate an output current of the power supply device, and the secondary conversion circuit comprises an inductance element for secondary filtering;
   a feedback control circuit, wherein an input end of the feedback control circuit is coupled to both ends of the inductance element, and the feedback control circuit is configured to sample the output current of the power supply device based on an impedance of the inductance element to obtain a current sampling value of the output current of the power supply device, and to generate a feedback signal according to the current sampling value; and
   a power adjustment circuit, coupled to an output end of the feedback control circuit, and configured to adjust the power coupled from the primary conversion circuit to the secondary conversion circuit via the transformer according to the feedback signal.

2. The power supply device of claim 1, wherein the feedback control circuit is further configured to communicate with a device to be charged, to control an output of the power supply device, such that an output voltage and/or an output current of the power supply device matches a present charging stage of a battery of the device to be charged.

3. The power supply device of claim 2, wherein the power supply device supports a first charging mode and a second charging mode, and a charging speed of the power supply device in the second charging mode is greater than a charging speed of the power supply device in the first charging mode;
   wherein the feedback control circuit is configured to communicate with the device to be charged to control the output of the power supply device in the second charging mode.

4. The power supply device of claim 3, wherein the feedback control circuit is configured to perform bidirectional communication with the device to be charged to negotiate a charging mode between the power supply device and the device to be charged.

5. The power supply device of claim 4, wherein the feedback control circuit is configured to send a first instruction to the device to be charged, the first instruction being configured to query the device to be charged whether to operate in the second charging mode;
   receive a reply instruction of the first instruction sent by the device to be charged, the reply instruction of the first instruction being configured to indicate whether the device to be charged agrees to operate in the second charging mode;
   control the power supply device to charge the device to be charged in the second charging mode when the device to be charged agrees to operate in the second charging mode.

6. The power supply device of claim 3, wherein the feedback control circuit is configured to:
   perform bidirectional communication with the device to be charged, to determine a charging voltage outputted by the power supply device in the second charging mode for charging the device to be charged; and
   adjust the output voltage of the power supply device, such that the output voltage of the power supply device is equal to the charging voltage outputted by the power supply device in the second charging mode for charging the device to be charged.

7. The power supply device of claim 6, wherein the feedback control circuit is configured to:
   send a second instruction to the device to be charged, the second instruction being configured to query whether the output voltage of the power supply device matches a present voltage of the battery of the device to be charged;
   receive a reply instruction of the second instruction sent by the device to be charged, the reply instruction of the second instruction being configured to indicate that the output voltage of the power supply device matches the present voltage of the battery, is higher than the present voltage of the battery, or is lower than the present voltage of the battery.

8. The power supply device of claim 3, wherein the feedback control circuit is configured to:
   perform bidirectional communication with the device to be charged, to determine a charging current outputted by the power supply device in the second charging mode for charging the device to be charged; and
   adjust the output current of the power supply device, such that the output current of the power supply device is equal to the charging current outputted by the power supply device in the second charging mode for charging the device to be charged.

9. The power supply device of claim 8, wherein the feedback control circuit is configured to:
   send a third instruction to the device to be charged, the third instruction being configured to query a maximum charging current presently supported by the device to be charged;
   receive a reply instruction of the third instruction sent by the device to be charged, the reply instruction of the third instruction being configured to indicate the maximum charging current presently supported by the device to be charged; and
   determine the charging current outputted by the power supply device in the second charging mode for charging the device to be charged according to the maximum charging current presently supported by the device to be charged.

10. The power supply device of claim 3, wherein the feedback control circuit is configured to:
    during charging in the second charging mode, perform bidirectional communication with the device to be charged to adjust the output current of the power supply device, such that the output current of the power supply device matches a charging current expected by the battery in the present charging stage.

11. The power supply device of claim 10, wherein the feedback control circuit is configured to:
send a fourth instruction to the device to be charged, the fourth instruction being configured to query a present voltage of the battery of the device to be charged;
receive a reply instruction of the fourth instruction sent by the device to be charged, the reply instruction of the fourth instruction being configured to indicate the present voltage of the battery;
determine the charging current expected by the battery in the present charging stage according to the present voltage of the battery; and
adjust the output current of the power supply device, such that the output current of the power supply device matches the charging current expected by the battery in the present charging stage.

12. The power supply device of claim 3, wherein the power supply device comprises a charging interface, and the feedback control circuit is configured to perform the bidirectional communication with the device to be charged via a data wire of the charging interface.

13. A charging control method, comprising:
performing primary rectification and/or primary filtering on input alternating current by a primary conversion;
performing secondary rectification and secondary filtering by a secondary conversion based on a power coupled from the primary conversion to the secondary conversion to generate an output current, wherein the secondary filtering is performed based on an inductance element;
sampling the output current based on an impedance of the inductance element to obtain a current sampling value of the output current, and generating a feedback signal according to the current sampling value; and
adjusting the power coupled from the primary conversion to the secondary conversion according to the feedback signal.

14. The charging control method of claim 13, wherein the charging control method is configured to control a power supply device, and further comprises:
communicating with a device to be charged, to control an output of the power supply device, such that an output voltage and/or an output current of the power supply device matches a present charging stage of a battery of the device to be charged.

15. The charging control method of claim 14, wherein the power supply device supports a first charging mode and a second charging mode, and a charging speed of the power supply device in the second charging mode is greater than a charging speed of the power supply device in the first charging mode,
communicating with the device to be charged to control the output of the power supply device comprises:
communicating with the device to be charged to control the output of the power supply device in the second charging mode.

16. The charging control method of claim 15, wherein communicating with the device to be charged to control the output of the power supply device comprises:
performing bidirectional communication with the device to be charged to negotiate a charging mode between the power supply device and the device to be charged,
wherein performing bidirectional communication with the device to be charged to negotiate the charging mode between the power supply device and the device to be charged comprises:
sending a first instruction to the device to be charged, the first instruction being configured to query the device to be charged whether to operate in the second charging mode;
receiving a reply instruction of the first instruction sent by the device to be charged, the reply instruction of the first instruction being configured to indicate whether the device to be charged agrees to operate in the second charging mode;
charging the device to be charged in the second charging mode when the device to be charged agrees to operate in the second charging mode.

17. The charging control method of claim 15, wherein communicating with the device to be charged to control the output of the power supply device in the second charging mode comprises:
performing bidirectional communication with the device to be charged, to determine a charging voltage outputted by the power supply device in the second charging mode for charging the device to be charged; and
adjusting the output voltage of the power supply device, such that the output voltage of the power supply device is equal to the charging voltage outputted by the power supply device in the second charging mode for charging the device to be charged;
wherein performing bidirectional communication with the device to be charged, to determine the charging voltage outputted by the power supply device in the second charging mode for charging the device to be charged, comprises:
sending a second instruction to the device to be charged, the second instruction being configured to query whether the output voltage of the power supply device matches a present voltage of the battery of the device to be charged;
receiving a reply instruction of the second instruction sent by the device to be charged, the reply instruction of the second instruction being configured to indicate that the output voltage of the power supply device matches the present voltage of the battery, is higher than the present voltage of the battery, or is lower than the present voltage of the battery.

18. The charging control method of claim 15, wherein communicating with the device to be charged to control the output of the power supply device in the second charging mode comprises:
performing bidirectional communication with the device to be charged, to determine a charging current outputted by the power supply device in the second charging mode for charging the device to be charged; and
adjusting the output current of the power supply device, such that the output current of the power supply device is equal to the charging current outputted by the power supply device in the second charging mode for charging the device to be charged,
wherein performing bidirectional communication with the device to be charged, to determine the charging current outputted by the power supply device in the second charging mode for charging the device to be charged, comprises:

sending a third instruction to the device to be charged, the third instruction being configured to query a maximum charging current presently supported by the device to be charged;

receiving a reply instruction of the third instruction sent by the device to be charged, the reply instruction of the third instruction being configured to indicate the maximum charging current presently supported by the device to be charged; and determining the charging current outputted by the power supply device in the second charging mode for charging the device to be charged according to the maximum charging current presently supported by the device to be charged.

19. The charging control method of claim 15, wherein performing bidirectional communication with the device to be charged to control the output of the power supply device in the second charging mode comprises:

during charging in the second charging mode, performing bidirectional communication with the device to be charged to adjust the output current of the power supply device, such that the output current of the power supply device matches a charging current expected by the battery in the present charging stage;

wherein performing bidirectional communication with the device to be charged to adjust the output current of the power supply device comprises:

sending a fourth instruction to the device to be charged, the fourth instruction being configured to query a present voltage of the battery of the device to be charged;

receiving a reply instruction of the fourth instruction sent by the device to be charged, the reply instruction of the fourth instruction being configured to indicate the present voltage of the battery;

determining the charging current expected by the battery in the present charging stage according to the present voltage of the battery; and adjusting the output current of the power supply device, such that the output current of the power supply device matches the charging current expected by the battery in the present charging stage.

20. A charging control method of using a power supply device that performs secondary conversion based on an inductance element, comprising:

operating the power supply device to perform primary conversion on input alternating current;

operating the power supply device to perform secondary conversion based on a power coupled from the primary conversion to the secondary conversion to generate an output current of the power supply device;

operating the power supply device to sample the output current of the power supply device based on an impedance of the inductance element to obtain a current sampling value of the output current of the power supply device, and to generate a feedback signal according to the current sampling value; and operating the power supply device to adjust the power coupled from the primary conversion to the secondary conversion according to the feedback signal.

* * * * *